US010581419B2

(12) United States Patent
Jang (10) Patent No.: US 10,581,419 B2
(45) Date of Patent: Mar. 3, 2020

(54) SKEW DETECTION CIRCUIT AND INPUT CIRCUIT USING THE SAME

(71) Applicant: SK hynix Inc., Icheon (KR)

(72) Inventor: Yeonsu Jang, Seoul (KR)

(73) Assignee: SK hynix, Inc., Icheon (KR)

( * ) Notice: Subject to any disclaimer, the term of this patent is extended or adjusted under 35 U.S.C. 154(b) by 0 days.

(21) Appl. No.: 16/436,777

(22) Filed: Jun. 10, 2019

(65) Prior Publication Data

US 2019/0296725 A1 Sep. 26, 2019

Related U.S. Application Data

(62) Division of application No. 16/111,053, filed on Aug. 23, 2018, now Pat. No. 10,361,691.

(30) Foreign Application Priority Data

Dec. 4, 2017 (KR) ........................ 10-2017-0165120

(51) Int. Cl.
*H03K 3/00* (2006.01)
*H03K 19/003* (2006.01)
*H03K 5/156* (2006.01)
*G01R 31/26* (2020.01)

(52) U.S. Cl.
CPC ....... *H03K 5/1565* (2013.01); *G01R 31/2621* (2013.01)

(58) Field of Classification Search
CPC .................... H03K 5/1565; G01R 31/2621
See application file for complete search history.

(56) References Cited

U.S. PATENT DOCUMENTS

| 7,493,509 | B2 * | 2/2009 | Fung | ........................ G06F 1/10 327/161 |
| 7,535,258 | B1 | 5/2009 | Johnson et al. | |
| 9,143,121 | B2 | 9/2015 | Gonzalez et al. | |
| 9,692,401 | B2 * | 6/2017 | Adachi | .................. H03K 5/156 |
| 10,361,691 | B2 * | 7/2019 | Jang | .................. G01R 31/2621 |
| 2008/0174336 | A1 | 7/2008 | Hur et al. | |

OTHER PUBLICATIONS

Khan, et al., "Techniques for On-Chip Process Voltage and Temperature Detection and Compensation," 19th International Conference on VLSI Design, 2006, pp. 6.
Kim, et al., "A Process Variation Compensating Technique with an On-Die Leakage Current Sensor for Nanometer Scale Dynamic Circuits," IEEE Transactions on Very Large Scale Integration (VLSI) Systems, 2006, vol. 14 (6), pp. 646-649.
Narendra, et al., "Sub-1 V Process-Compensated MOS Current Generation without Voltage Reference," Symposium on VLSI Circuits. Digest of Technical Papers, 2001, pp. 143-144.
Wang, et al., "On-Chip Process and Temperature Monitor for Self-Adjusting Slew Rate Control of 2 x VDD Output Suffers," IEEE Transactions on Circuits and Systems I: Regular Papers, 2013, vol. 60 (6), pp. 1432-1440.

* cited by examiner

*Primary Examiner* — Kenneth B Wells (57) ABSTRACT

A skew detection circuit may include a bias circuit configured to generate a first bias signal and a second bias signal, a reference voltage circuit configured to generate a third bias signal and a fourth bias signal, and a detection circuit configured to generate, using the first to fourth bias signals, a plurality of skew detection signals. The skew detection signals may correspond to effects of one or more of process variations, voltage variations, and temperature variations.

9 Claims, 7 Drawing Sheets

| Process | Temp(°C) | ISINK_EN | ISOURCE_ENB |
|---------|----------|----------|-------------|
| SF | -10 | 1 | 0 |
| SF | 95 | 1 | 0 |
| TF | 95 | 1 | 0 |
| ST | -10 | 1 | 0 |
| FS | -10 | 0 | 1 |
| FS | 95 | 0 | 1 |
| TS | -10 | 0 | 1 |
| FT | 95 | 0 | 1 |

SKEW DETECTION CIRCUIT AND INPUT CIRCUIT USING THE SAME

CROSS-REFERENCES TO RELATED APPLICATION

The present application is a divisional of U.S. application Ser. No. 16/111,053, filed Aug. 23, 2018 which claims priority under 35 U.S.C. § 119(a) to Korean application number 10-2017-0165120, filed on Dec. 4, 2017, in the Korean Intellectual Property Office, which is incorporated herein by reference in its entirety.

BACKGROUND

1. Technical Field

Various embodiments generally relate to a semiconductor circuit, and, more particularly, to a skew detection circuit and an input circuit using the skew detection circuit.

2. Related Art

A semiconductor device may include a plurality of buffers configured to receive a signal provided from an external device or output a signal.

Since a buffer is sensitive to process-voltage-temperature (PVT) variation, a skew, e.g., duty cycle variation, may be caused by, for example, process-variation-induced differences in drive strengths between p-channel and n-channel transistors. The variation in duty cycle leads to deterioration in operation performance of the buffer.

SUMMARY

Various embodiments may provide a skew detection circuit capable of reducing duty cycle variation, and an input circuit using the skew detection circuit.

In an embodiment, a skew detection circuit may include: a bias circuit configured to generate a first bias signal and a second bias signal; a reference voltage circuit configured to generate a third bias signal and a fourth bias signal; and a detection circuit configured to generate a plurality of skew detection signals in response to the first to fourth biases.

In an embodiment, an input circuit may include: a skew detection circuit configured to operate a basic logic element forming a semiconductor device in each of a saturation region and a subthreshold region, and detect characteristic variation of the basic logic elements depending on variation in process, operating voltage or temperature, and generate a plurality of skew detection signals; an operation circuit configured to generate a source control signal and a sink control signal by combining the plurality of skew detection signals; and a buffer configured to vary the amount of source current in response to the source control signal and vary the amount of sink current in response to the sink control signal.

In an embodiment, an input circuit may include: a temperature sensor configured to generate temperature codes by sensing a temperature of a semiconductor apparatus; a bias circuit configured to generate a first bias signal and a second bias signal; a reference voltage circuit configured to generate a third bias signal and a fourth bias signal according to the temperature codes; and a detection circuit configured to generate a plurality of skew detection signals in response to the first to fourth bias signals.

DETAILED DESCRIPTION

Hereinafter, a skew detection circuit and an input circuit using the skew detection circuit will be described below with reference to the accompanying drawings through various examples of embodiments.

Figure 1:
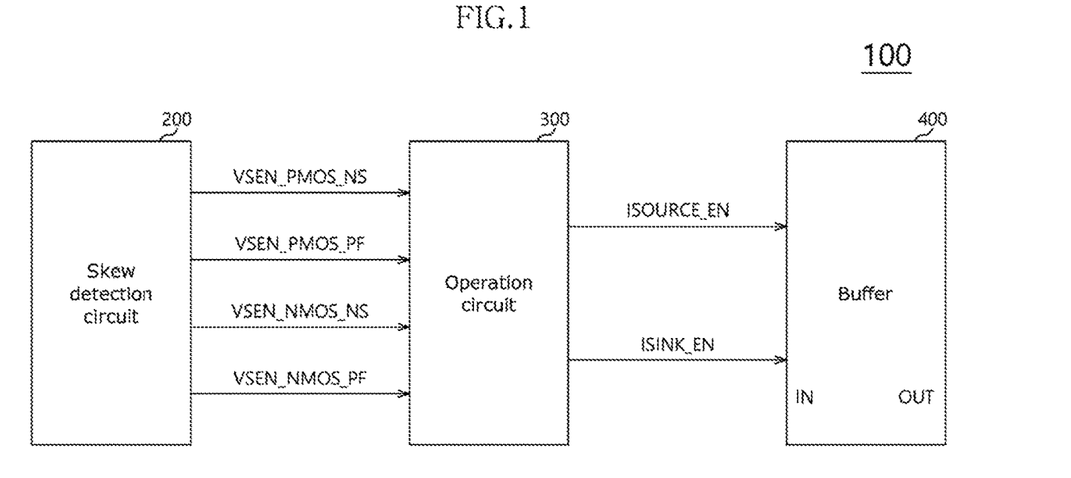
FIG. 1 is a diagram illustrating a configuration of an input circuit (100) of a semiconductor apparatus in accordance with an embodiment.

FIG. 1 is a diagram illustrating a configuration of an input circuit 100 of a semiconductor apparatus in accordance with an embodiment.

Referring to FIG. 1, the input circuit 100 of the semiconductor apparatus in accordance with the embodiment may include a skew detection circuit 200, an operation circuit 300, and a buffer 400.

The skew detection circuit 200 may detect variation in skew characteristics, e.g., characteristic variation depending on variation in process, operating voltage, or temperature, of a p-channel MOS (PMOS) transistor and an n-channel MOS (NMOS) transistor, which are basic elements, and may generate first to fourth skew detection signals VSEN_PMOS_NS, VSEN_PMOS_PF, VSEN_NMOS_NS, and VSEN_NMOS_PF.

The skew detection circuit 200 may operate a first PMOS transistor and a first NMOS transistor in a saturation region, and may operate a second PMOS transistor and a second NMOS transistor in a subthreshold region. The skew detection circuit 200 may detect characteristic variation depending on variation in process using the first and second PMOS and first and second NMOS transistors, operating voltage, or temperature, and may generate the first to fourth skew detection signals VSEN_PMOS_NS, VSEN_PMOS_PF, VSEN_NMOS_NS, and VSEN_NMOS_PF.

The operation circuit 300 may generate, using the first to fourth skew detection signals VSEN_PMOS_NS, VSEN_PMOS_PF, VSEN_NMOS_NS, and VSEN_NMOS_PF, a source control signal ISOURCE_EN for varying the amount of source current of the buffer 400 and a sink control signal ISINK_EN for varying the amount of sink current of the buffer 400.

The buffer 400 may vary the amount of source current in response to the source control signal ISOURCE_EN, and vary the amount of sink current in response to the sink control signal ISINK_EN, thus compensating for variation in duty cycle (that may result from, for example, differences between rise and fall times of a signal) caused by process variation.

Figure 2:
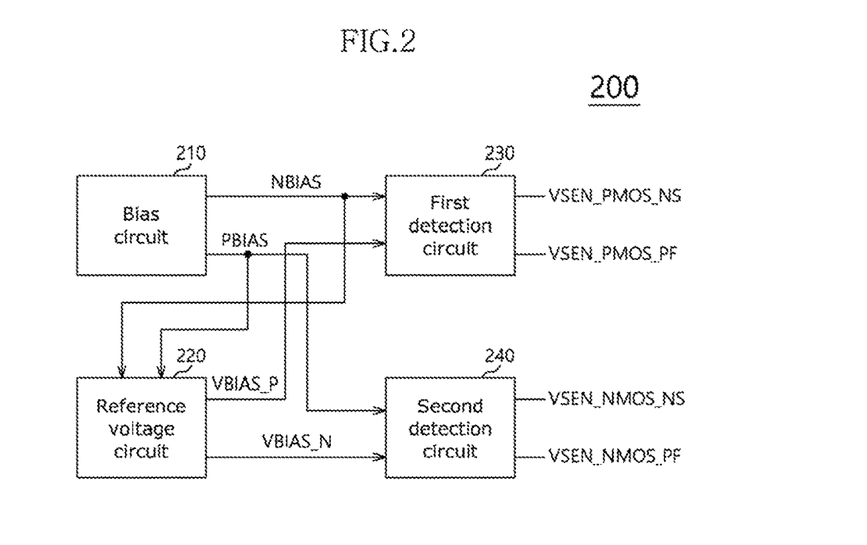
FIG. 2 is a diagram illustrating a configuration of a skew detection circuit (200) of FIG. 1.

FIG. 2 is a diagram illustrating a configuration of the skew detection circuit 200 of FIG. 1.

Referring to FIG. 2, the skew detection circuit 200 may include a bias circuit 210, a reference voltage circuit 220, a first detection circuit 230, and a second detection circuit 240.

The bias circuit 210 may generate a first bias signal NBIAS having a voltage value suitable for operating an NMOS transistor in the saturation region, and a second bias signal PBIAS having a voltage value suitable for operating a PMOS transistor in the saturation region. In an embodiment, the first bias signal NBIAS corresponds to a voltage having a magnitude, relative to ground, greater than a threshold voltage of the NMOS transistor, and the second bias signal PBIAS corresponds to a voltage having a magnitude, relative to the supply voltage, greater than a threshold voltage of the PMOS transistor.

The reference voltage circuit 220 may generate a third bias signal VBIAS_N having a voltage value suitable for operating an NMOS transistor in the subthreshold region, and a fourth bias signal VBIAS_P having a voltage value suitable for operating a PMOS transistor in the subthreshold region according to the first bias signal NBIAS and the second bias signal PBIAS. In an embodiment, the third bias signal VBIAS_N corresponds to a voltage having a magnitude, relative to ground, less than the threshold voltage of the NMOS transistor, and the fourth bias signal VBIAS_P corresponds to a voltage having a magnitude, relative to the supply voltage, less than the threshold voltage of the PMOS transistor.

The first detection circuit 230 may sense variation of an operating point of the PMOS transistor depending on PVT variation.

The first detection circuit 230 may generate the first skew detection signal VSEN_PMOS_NS and the second skew detection signal VSEN_PMOS_PF in response to the first bias signal NBIAS and the fourth bias signal VBIAS_P.

The second detection circuit 240 may sense variation of an operating point of the NMOS transistor depending on PVT variation.

The second detection circuit 240 may generate the third skew detection signal VSEN_NMOS_NS and the fourth skew detection signal VSEN_NMOS_PF in response to the second bias signal PBIAS and the third bias signal VBIAS_N.

Figure 3:
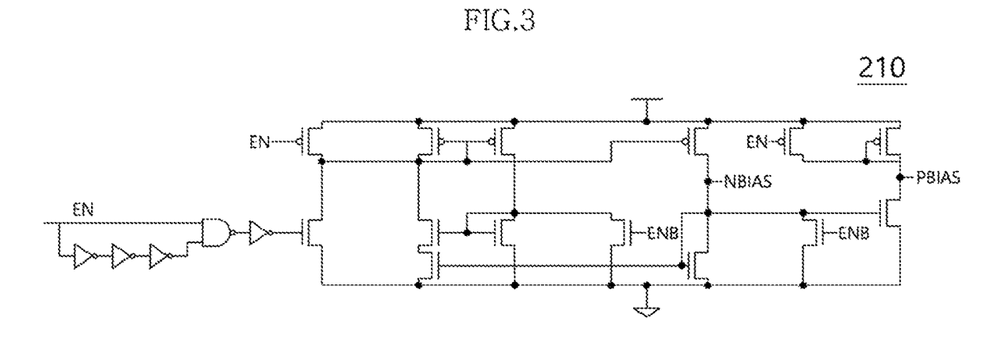
FIG. 3 is a diagram illustrating a configuration of a bias circuit (210) of FIG. 2.

FIG. 3 is a diagram illustrating a configuration of the bias circuit 210 of FIG. 2. The bias circuit 210 includes a current source subcircuit and first and second bias-voltage subcircuits.

Referring to FIG. 3, the bias circuit 210 may be configured of a Widlar bias circuit and generate the first bias signal NBIAS and the second bias signal PBIAS in response to an enable signal pair EN/ENB.

Figure 4:
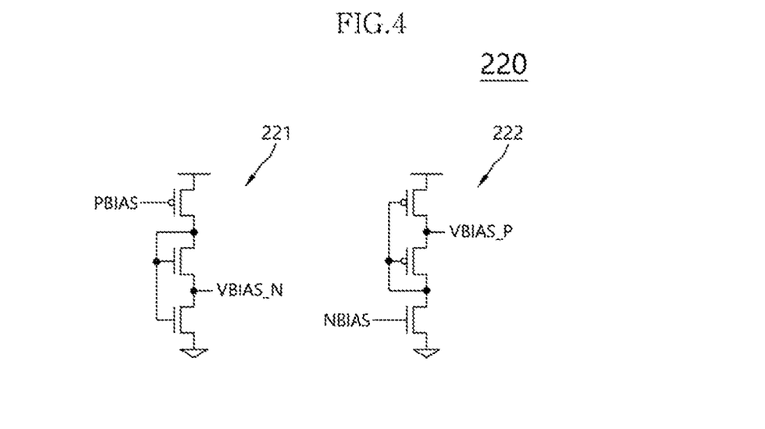
FIG. 4 is a diagram illustrating a configuration of a reference voltage circuit (220) of FIG. 2.

FIG. 4 is a diagram illustrating a configuration of the reference voltage circuit 220 of FIG. 2.

Referring to FIG. 4, the reference circuit 220 may include a first divider circuit 221 and a second divider circuit 222.

Each of the first and second divider circuits 221 and 222 may comprise transistors configured to operate as resistors.

The first divider circuit 221 may include a PMOS transistor coupled to a power source terminal and two NMOS transistors serially coupled between the PMOS transistor and a ground terminal. The PMOS transistor coupled to the power source terminal may receive, through gate thereof, the second bias signal PBIAS. The first divider circuit 221 may generate the third bias signal VBIAS_N by distributing a power source voltage at a first distribution ratio. The third bias signal VBIAS_N may have a value proportional to a threshold voltage of the NMOS transistors in the first divider circuit 221.

The second divider circuit 222 may include a NMOS transistor coupled to a ground terminal and two PMOS transistors serially coupled between the NMOS transistor and a power source terminal. The NMOS transistor coupled to the ground terminal may receive, through gate thereof, the first bias signal NBIAS. The second divider circuit 222 may generate the fourth bias signal VBIAS_P by distributing the power source voltage at a second distribution ratio. The fourth bias signal VBIAS_P may have a value proportional to a threshold voltage of the PMOS transistors in the second divider circuit 222.

Figure 5:
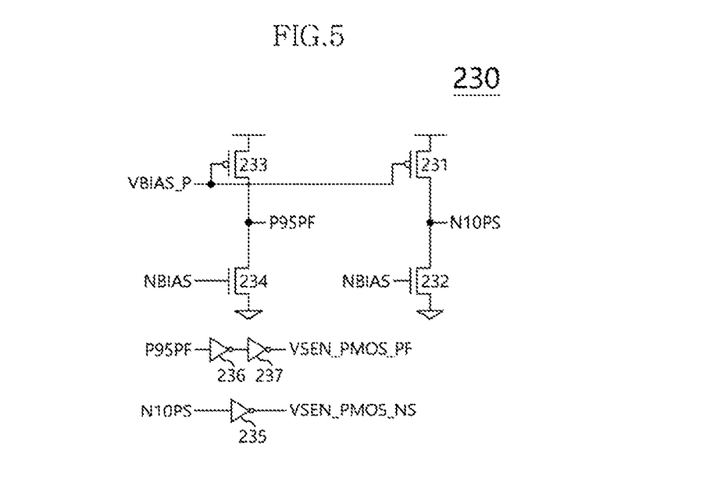
FIG. 5 is a diagram illustrating a configuration of a first detection circuit (230) of FIG. 2.

FIG. 5 is a diagram illustrating a configuration of the first detection circuit 230 of FIG. 2.

Referring to FIG. 5, the first detection circuit 230 may include first to fourth transistors 231 to 234 and first to third inverters 235 to 237.

The first transistor 231 may be a PMOS transistor, and include a source coupled with a power source terminal.

The second transistor 232 may be an NMOS transistor, and include a source coupled with a ground terminal, and a drain coupled with a drain of the first transistor 231.

The third transistor 233 may be a PMOS transistor, and include a source coupled with the power source terminal.

The fourth transistor 234 may be an NMOS transistor, and include a source coupled with the ground terminal, and a drain coupled with a drain of the third transistor 233.

The first and third transistors 231 and 233 may receive, through gates thereof, the fourth bias signal VBIAS_P in common.

The second and fourth transistors 232 and 234 may receive, through gates thereof, the first bias signal NBIAS in common.

A first preliminary skew detection signal N10PS may be outputted from a node to which the first transistor 231 and the second transistor 232 are coupled.

A second preliminary skew detection signal P95PF may be outputted from a node to which the third transistor 233 and the fourth transistor 234 are coupled.

The first and third transistors 231 and 233 are operated in the subthreshold region in response to the fourth bias signal VBIAS_P, and the second and fourth transistors 232 and 234 are operated in the saturation region in response to the first bias signal NBIAS. Therefore, variation in operating points of the PMOS transistors, i.e., the first and third transistors 231 and 233 that are operated in the subthreshold region, may be outputted as the first preliminary skew detection signal N10PS and the second preliminary skew detection signal P95PF.

The first inverter 235 may convert the level of the first preliminary skew detection signal N10PS to a CMOS level and output it as the first skew detection signal VSEN_PMOS_NS. In an embodiment, in response to a value of the first preliminary skew detection signal N10PS being greater than a threshold voltage of the first inverter 235, the first inverter 235 outputs a signal having a CMOS logic low level, and in response to a value of the first preliminary skew detection signal N10PS being less than the threshold voltage of the first inverter 235, the first inverter 235 outputs a signal having a CMOS logic high level.

The second and third inverters 236 and 237 may convert the level of the second preliminary skew detection signal P95PF to a CMOS level and output it as the second skew detection signal VSEN_PMOS_PF. In an embodiment, in response to a value of the second preliminary skew detection signal P95PF being greater than a threshold voltage of the second inverter 236, the third inverter 237 outputs a signal having a CMOS logic high level, and in response to a value of the second preliminary skew detection signal P95PF being less than the threshold voltage of the second inverter 236, the third inverter 237 outputs a signal having a CMOS logic low level.

Figure 6:
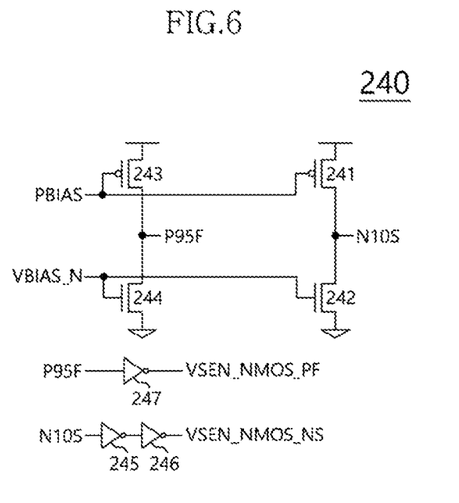
FIG. 6 is a diagram illustrating a configuration of a second detection circuit (240) of FIG. 2.

FIG. 6 is a diagram illustrating a configuration of the second detection circuit 240 of FIG. 2.

Referring to FIG. 6, the second detection circuit 240 may include first to fourth transistors 241 to 244 and first to third inverters 245 to 247.

The first transistor 241 may be a PMOS transistor, and include a source coupled with the power source terminal.

The second transistor 242 may be an NMOS transistor, and include a source coupled with the ground terminal, and a drain coupled with a drain of the first transistor 241.

The third transistor 243 may be a PMOS transistor, and include a source coupled with the power source terminal.

The fourth transistor 244 may be an NMOS transistor, and include a source coupled with the ground terminal, and a drain coupled with a drain of the third transistor 243.

The first and third transistors 241 and 243 may receive, through gates thereof, the second bias signal PBIAS in common.

The second and fourth transistors 242 and 244 may receive, through gates thereof, the third bias signal VBIAS_N in common.

A third preliminary skew detection signal N10S may be outputted from a node to which the first transistor 241 and the second transistor 242 are coupled.

A fourth preliminary skew detection signal P95F may be outputted from a node to which the third transistor 243 and the fourth transistor 244 are coupled.

The first and third transistors 241 and 243 are operated in the saturation region in response to the second bias signal PBIAS, and the second and fourth transistors 242 and 244 are operated in the subthreshold region in response to the third bias signal VBIAS_N. Therefore, variation in operating points of the NMOS transistors, i.e., the second and fourth transistors 242 and 244 that are operated in the subthreshold region, may be outputted as the third preliminary skew detection signal N10S and the fourth preliminary skew detection signal P95F.

The first inverter 245 may convert the level of the third preliminary skew detection signal N10S to a CMOS level and output it as the third skew detection signal VSEN_NMOS_NS. In an embodiment, in response to a value of the third preliminary skew detection signal N10S being greater than a threshold voltage of the first inverter 245, the first inverter 245 outputs a signal having a CMOS logic low level, and in response to a value of the third preliminary skew detection signal N10S being less than the threshold voltage of the first inverter 245, the first inverter 245 outputs a signal having a CMOS logic high level.

The second and third inverters 246 and 247 may convert the level of the fourth preliminary skew detection signal P95F to a CMOS level and output it as the fourth skew detection signal VSEN_NMOS_PF. In an embodiment, in response to a value of the fourth preliminary skew detection signal P95F being greater than a threshold voltage of the second inverter 246, the third inverter 247 outputs a signal having a CMOS logic high level, and in response to a value of the fourth preliminary skew detection signal P95F being less than the threshold voltage of the second inverter 246, the third inverter 247 outputs a signal having a CMOS logic low level.

Figure 7:
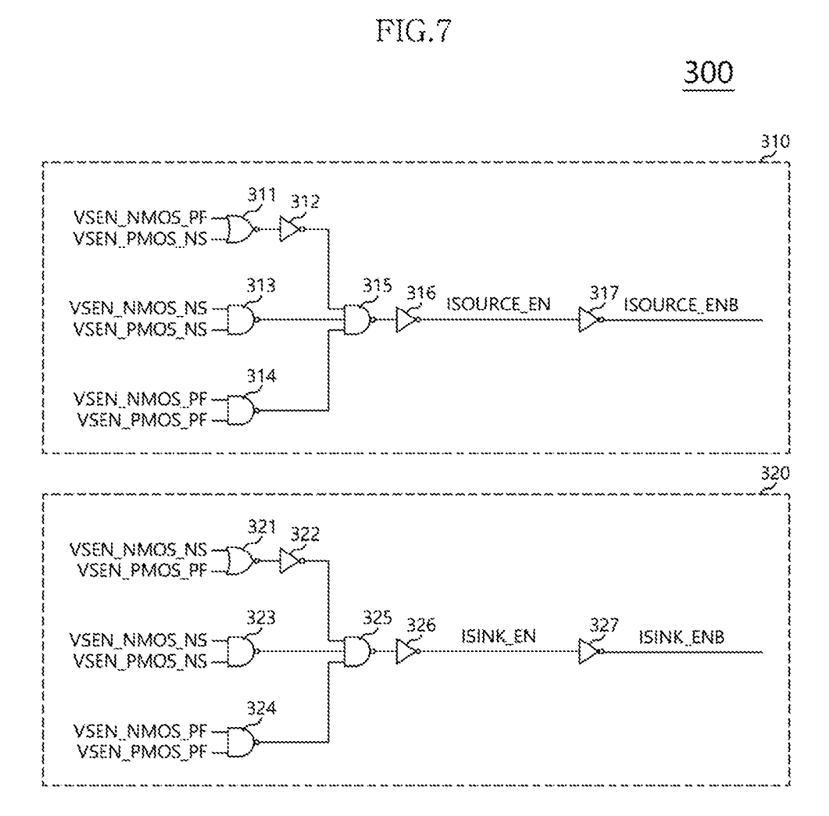
FIG. 7 is a diagram illustrating a configuration of an operation circuit (300) of FIG. 1.
Figure 8:
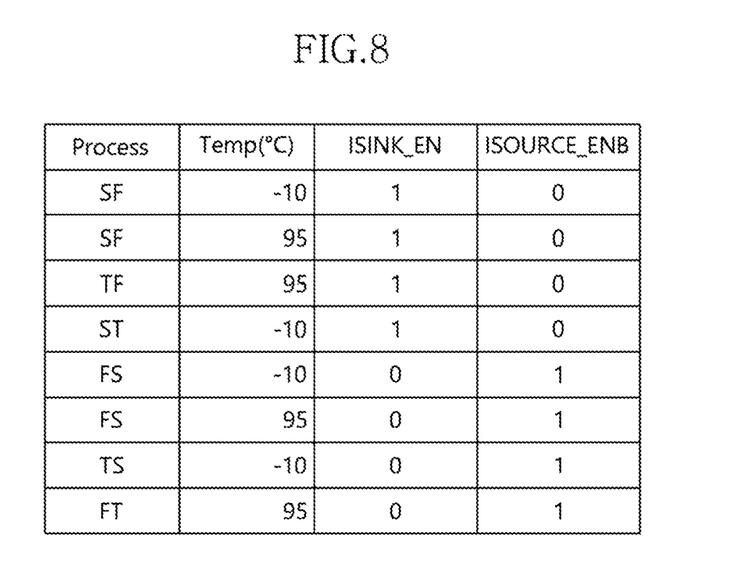
FIG. 8 is a truth table for describing the operation of the operation circuit (300) of FIG. 7.

FIG. 7 is a diagram illustrating a configuration of the operation circuit 300 of FIG. 1, and FIG. 8 is a truth table for describing the operation of the operation circuit 300 of FIG. 7.

The operation circuit 300 of FIG. 7 may be designed based on the truth table of FIG. 8.

To verify variation in external environment and process with simulation, phased conditions such as 'FF', 'FT', 'FS', 'TF', 'TT', 'TS', 'SF', 'ST', and 'SS' may be used, and there are predetermined skew differences between respective conditions based on 'TT'. Here, 'F' denotes a fast condition, 'T' denotes a typical condition, and 'S' denotes a slow condition. A first letter of each pair indicates a condition of N-type (n-channel) devices, and a second letter of each pair indicates a condition of P-type (p-channel) devices. Thus, 'FF' denotes a process variation that produced fast n-channel devices and fast p-channel devices, 'FT' denotes a process variation that produced fast n-channel devices and typical p-channel devices, 'SF' denotes a process variation that produced slow n-channel devices and fast p-channel devices, and so on.

In the embodiment, there is described an example configured such that, as shown in the truth table of FIG. 8, when the process is in 'SF' or 'ST' under a certain temperature condition, e.g., at −10° C., and in 'SF' or 'TF' at 95° C., the sink control signal ISINK_EN is enabled and the source control signal ISOURCE_EN is enabled, and when the process is in 'XS' at −10° C. and 'FY' at 95° C., the sink control signal ISINK_EN is disabled and the source control signal ISOURCE_EN is disabled.

In an embodiment shown in FIG. 8, each of the sink control signal ISINK_EN and the source control signal ISOURCE_EN may be enabled to a high level. When the source control signal ISOURCE_EN has a high level, a subsidiary source control signal ISOURCE_ENB has a low level. When the source control signal ISOURCE_EN has a low level, the subsidiary source control signal ISOURCE_ENB has a high level.

The duty cycle variation may be compensated for by increasing the source current and the sink current of the buffer 400 in response the subsidiary source control signal ISOURCE_ENB having a low level and the sink control signal ISINK_EN having a high level.

Referring to FIG. 7, the operation circuit 300 may include a first logic circuit 310 and a second logic circuit 320.

The first logic circuit 310 may generate the source control signal ISOURCE_EN by performing a first combination operation on the first to fourth skew detection signals VSEN_PMOS_NS, VSEN_PMOS_PF, VSEN_NMOS_NS, and VSEN_NMOS_PF.

Referring to FIGS. 5, 6, and 8, the first skew detection signal VSEN_PMOS_NS, which is generated based on the first preliminary skew detection signal N10PS, may indicate slow PMOS devices at −10° C. The second skew detection signal VSEN_PMOS_PF, which is generated based on the second preliminary skew detection signal P95PF, may indicate fast PMOS devices at 95° C. The third skew detection signal VSEN_NMOS_NS, which is generated based on the third preliminary skew detection signal N10S, may indicate slow NMOS devices at −10° C. The fourth skew detection signal VSEN_NMOS_PF, which is generated based on the fourth preliminary skew detection signal P95F, may indicate fast NMOS devices at 95° C. Accordingly, the source control signal ISOURCE_EN is generated using operating points of slow PMOS devices at −10° C., fast PMOS devices at 95° C., slow NMOS devices at −10° C., and fast NMOS devices at 95° C.

Referring back to FIG. 7, the first logic circuit 310 may include first to seventh logic gates 311 to 317.

The first and second logic gates 311 and 312 may perform a logical OR operation on the fourth skew detection signal VSEN_NMOS_PF and the first skew detection signal VSEN_PMOS_NS and output a resultant signal.

The third logic gate 313 may perform a NAND operation on the third skew detection signal VSEN_NMOS_NS and the first skew detection signal VSEN_PMOS_NS and output a resultant signal.

The fourth logic gate 314 may perform a NAND operation on the fourth skew detection signal VSEN_NMOS_PF and the second skew detection signal VSEN_PMOS_PF and output a resultant signal.

The fifth and sixth logic gates 315 and 316 may perform a logical AND operation on the outputs of the second to fourth logic gates 312 to 314 and output a resultant signal as the source control signal ISOURCE_EN.

The seventh logic gate 317 may invert the output of the sixth logic gate 316 and output a resultant signal as the subsidiary source control signal ISOURCE_ENB.

The second logic circuit 320 may generate the sink control signal ISINK_EN by performing a second combination operation on the first to fourth skew detection signals VSEN_PMOS_NS, VSEN_PMOS_PF, VSEN_NMOS_NS, and VSEN_NMOS_PF. Similar to the source control signal ISOURCE_EN, the sink control signal ISINK_EN is also generated using operating points of slow PMOS devices at −10° C., fast PMOS devices at 95° C., slow NMOS devices at −10° C., and fast NMOS devices at 95° C.

The second logic circuit 320 may include first to seventh logic gates 321 to 327.

The first and second logic gates 321 and 322 may perform a logical OR operation on the third skew detection signal VSEN_NMOS_NS and the second skew detection signal VSEN_PMOS_PF and output a resultant signal.

The third logic gate 323 may perform a NAND operation on the third skew detection signal VSEN_NMOS_NS and the first skew detection signal VSEN_PMOS_NS and output a resultant signal.

The fourth logic gate 324 may perform a NAND operation on the fourth skew detection signal VSEN_NMOS_PF and the second skew detection signal VSEN_PMOS_PF and output a resultant signal.

The fifth and sixth logic gates 325 and 326 may perform a logical AND operation on the outputs of the second to fourth logic gates 322 to 324 and output a resultant signal as the sink control signal ISINK_EN.

The seventh logic gate 327 may invert the output of the sixth logic gate 326 and output a resultant signal as a subsidiary sink control signal ISINK_ENB.

Figure 9:
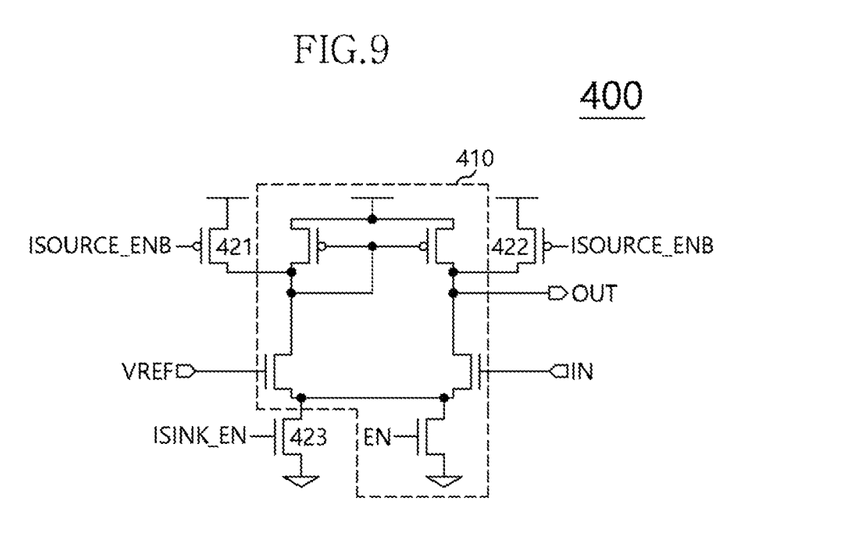
FIG. 9 is a diagram illustrating an example of a configuration of a buffer (400) of FIG. 1.

FIG. 9 is a diagram illustrating an example of a configuration of the buffer 400 of FIG. 1.

Referring to FIG. 9, the buffer 400 may include an amplifier circuit 410 provided with first and second source current transistors 421 and 422 and a sink current transistor 423.

The amplifier circuit 410 may be enabled in response to an enable signal EN, and amplify an input signal IN relative to a reference voltage VREF to generate an output signal OUT.

The first and second source current transistors 421 and 422 may provide an additional current source to the amplifier circuit 410 and increase the source current of the amplifier circuit 410 in response to the subsidiary source control signal ISOURCE_ENB.

In the case where the source control signal ISOURCE_EN is enabled to a high level, the subsidiary source control signal ISOURCE_ENB has a low level.

The first and second source current transistors 421 and 422 may increase the source current of the amplifier circuit 410 when the subsidiary source control signal ISOURCE_ENB has a low level.

The sink current transistor 423 may provide an additional current sink to the amplifier circuit 410 and increase the sink current of the amplifier circuit 410 in response to the sink control signal ISINK_EN.

Figure 10:
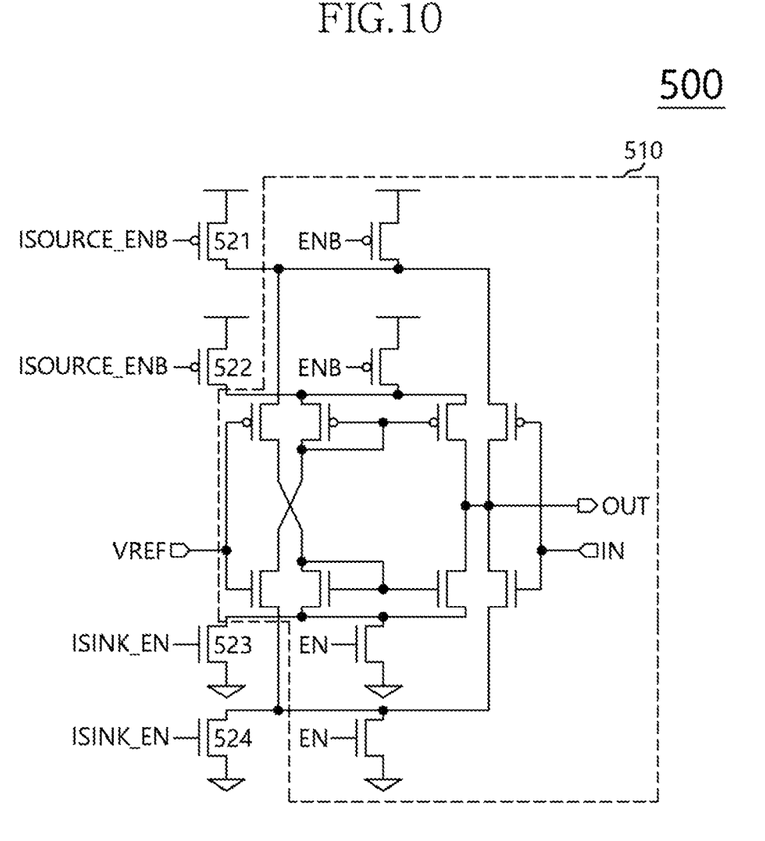
FIG. 10 is a diagram illustrating another example of the configuration of the buffer (400) of FIG. 1.

FIG. 10 is a diagram illustrating another example of the configuration of the buffer 400 of FIG. 1.

Referring to FIG. 10, a buffer 500 may include an amplifier circuit 510 provided with first and second source current transistors 521 and 522 and first and second sink current transistors 523 and 524.

The amplifier circuit 510 may have a rail-to-rail structure, be enabled in response to an enable signal EN, and amplify an input signal IN relative to a reference voltage VREF to generate an output signal OUT.

The rail-to-rail structure may be a structure designed to allow the output signal OUT to have full swing over the entire range of a power source voltage.

The first and second source current transistors 521 and 522 may provide additional current sources to the amplifier circuit 510 and increase the source current of the amplifier circuit 510 in response to the subsidiary source control signal ISOURCE_ENB.

In the case where the source control signal ISOURCE_EN is enabled to a high level, the subsidiary source control signal ISOURCE_ENB has a low level.

The first and second source current transistors 521 and 522 may increase the source current of the amplifier circuit 510 when the subsidiary source control signal ISOURCE_ENB has a low level.

The first and second sink current transistors 523 and 524 may provide additional current sinks to the amplifier circuit 510 and increase the sink current of the amplifier circuit 510 in response to the sink control signal ISINK_EN.

The above-described buffer 500 may compensate for a skew, i.e., duty cycle variation, by varying the source current or sink current in response to the source control signal ISOURCE_EN and the sink control signal ISINK_EN that are generated by detecting, as shown in the truth table of FIG. 8, characteristic variation depending on variation in process, operating voltage, or temperature through the skew detection circuit 200 and the operation circuit 300.

Therefore, the buffer 500 may maintain the duty cycle constant regardless of the characteristic variation depending on the variation in process, operating voltage, or temperature.

Figure 11:
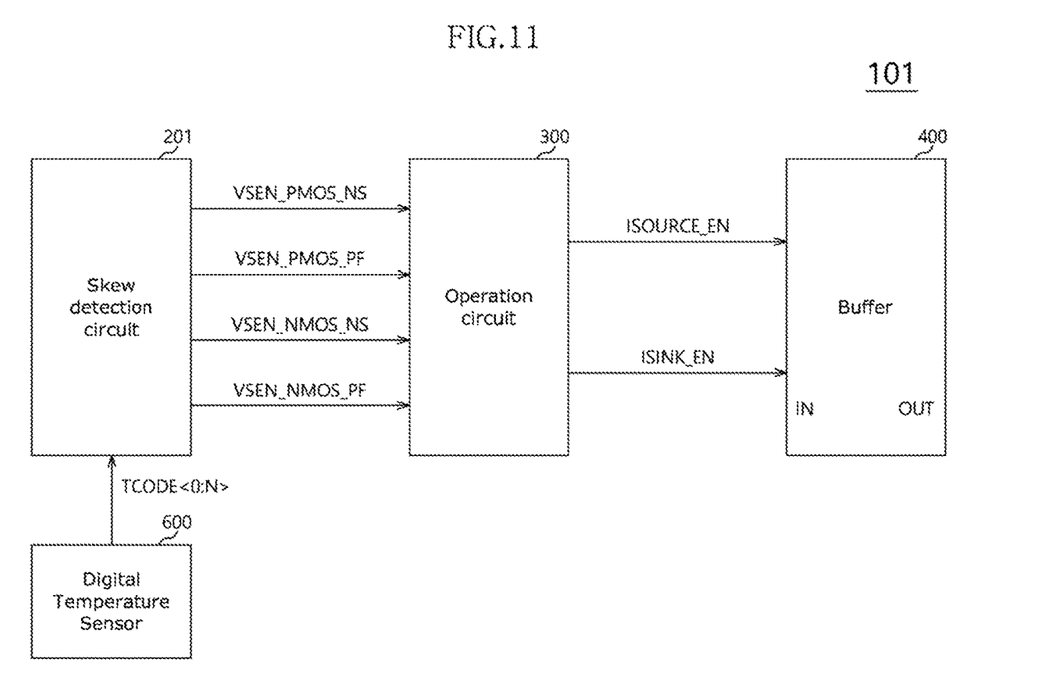
FIG. 11 is a diagram illustrating a configuration of an input circuit (101) of a semiconductor apparatus in accordance with another embodiment.

FIG. 11 is a diagram illustrating a configuration of an input circuit 101 of a semiconductor apparatus in accordance with another embodiment.

Referring to FIG. 11, the input circuit 101 of the semiconductor apparatus in accordance with the embodiment may include a skew detection circuit 201, an operation circuit 300, and a buffer 400. The input circuit 101 may further include a digital temperature sensor 600.

The skew detection circuit 201 may detect variation in skew characteristics, e.g., characteristic variation depending on variation in process, operating voltage, or temperature, of a p-channel MOS (PMOS) transistor and an n-channel MOS (NMOS) transistor, which are basic elements according to temperature codes TCODE<0:N>, and may generate first to fourth skew detection signals VSEN_PMOS_NS, VSEN_PMOS_PF, VSEN_NMOS_NS, and VSEN_NMOS_PF.

The skew detection circuit 201 may operate a first PMOS transistor and a first NMOS transistor in a saturation region, and may operate a second PMOS transistor and a second NMOS transistor in a subthreshold region. The skew detection circuit 201 may detect characteristic variation depending on variation in process using the first and second PMOS and first and second NMOS transistors, operating voltage, or temperature according to bias signals (will be disclosed later as VBIAS_N and VBIAS_P with reference to FIG. 12), and may generate the first to fourth skew detection signals VSEN_PMOS_NS, VSEN_PMOS_PF, VSEN_NMOS_NS, and VSEN_NMOS_PF. Voltage levels of the bias signals are compensated by the temperature codes TCODE<0:N>.

The operation circuit 300 may generate, using the first to fourth skew detection signals VSEN_PMOS_NS, VSEN_PMOS_PF, VSEN_NMOS_NS, and VSEN_NMOS_PF, a source control signal ISOURCE_EN for varying the amount of source current of the buffer 400 and a sink control signal ISINK_EN for varying the amount of sink current of the buffer 400.

The buffer 400 may vary the amount of source current in response to the source control signal ISOURCE_EN, and vary the amount of sink current in response to the sink control signal ISINK_EN, thus compensating for variation in duty cycle (that may result from, for example, differences between rise and fall times of a signal) caused by process variation.

The digital temperature sensor 600 generates the temperature codes TCODE<0:N> by sensing a temperature of the semiconductor apparatus in accordance with the embodiment. Value of the temperature codes TCODE<0:N> may be changed according to sensed temperature. The semiconductor apparatus in accordance with the embodiment may include TCSR (Temperature Compensated Self Refresh) Circuit. The TCSR Circuit may include a temperature sensor. The input circuit 101 of the semiconductor apparatus may use the temperature sensor included in the TCSR Circuit as the digital temperature sensor 600. For example, a value of the temperature codes TCODE<0:N> can increase proportional to a sensed temperature.

Figure 12:
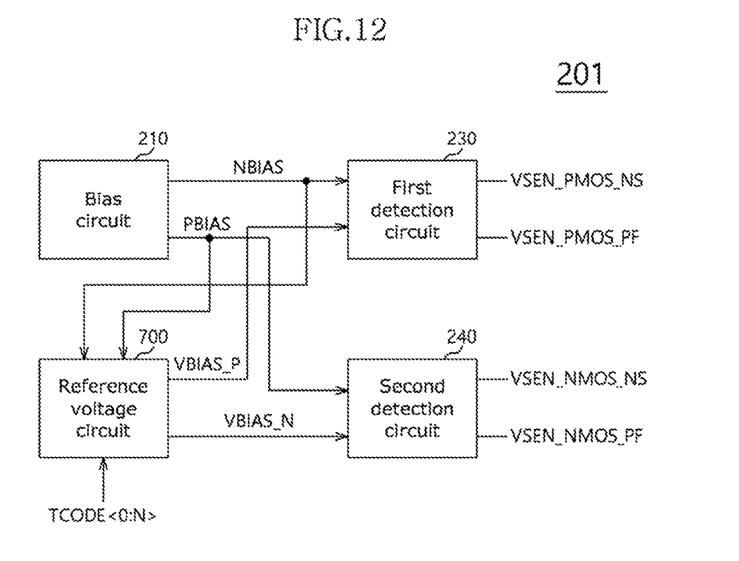
FIG. 12 is a diagram illustrating a configuration of a skew detection circuit (201) of FIG. 11.

FIG. 12 is a diagram illustrating a configuration of the skew detection circuit 201 of FIG. 11.

Referring to FIG. 12, the skew detection circuit 201 may include a bias circuit 210, a reference voltage circuit 700, a first detection circuit 230, and a second detection circuit 240.

The bias circuit 210 may generate a first bias signal NBIAS having a voltage value suitable for operating an NMOS transistor in the saturation region, and a second bias signal PBIAS having a voltage value suitable for operating a PMOS transistor in the saturation region. In an embodiment, the first bias signal NBIAS corresponds to a voltage having a magnitude, relative to ground, greater than a threshold voltage of the NMOS transistor, and the second bias signal PBIAS corresponds to a voltage having a magnitude, relative to the supply voltage, greater than a threshold voltage of the PMOS transistor.

The reference voltage circuit 700 may generate a third bias signal VBIAS_N having a voltage value suitable for operating an NMOS transistor in the subthreshold region and a fourth bias signal VBIAS_P having a voltage value suitable for operating a PMOS transistor in the subthreshold region according to the temperature codes TCODE<0:N>. The reference voltage circuit 700 may also generate the first bias signal NBIAS and the second bias signal PBIAS. In an embodiment, the third bias signal VBIAS_N corresponds to a voltage having a magnitude, relative to ground, less than the threshold voltage of the NMOS transistor, and the fourth bias signal VBIAS_P corresponds to a voltage having a magnitude, relative to the supply voltage, less than the threshold voltage of the PMOS transistor.

The first detection circuit 230 may sense variation of an operating point of the PMOS transistor depending on PVT variation.

The first detection circuit 230 may generate the first skew detection signal VSEN_PMOS_NS and the second skew detection signal VSEN_PMOS_PF in response to the first bias signal NBIAS and the fourth bias signal VBIAS_P.

The second detection circuit 240 may sense variation of an operating point of the NMOS transistor depending on PVT variation.

The second detection circuit 240 may generate the third skew detection signal VSEN_NMOS_NS and the fourth skew detection signal VSEN_NMOS_PF in response to the second bias signal PBIAS and the third bias signal VBIAS_N.

Figure 13:
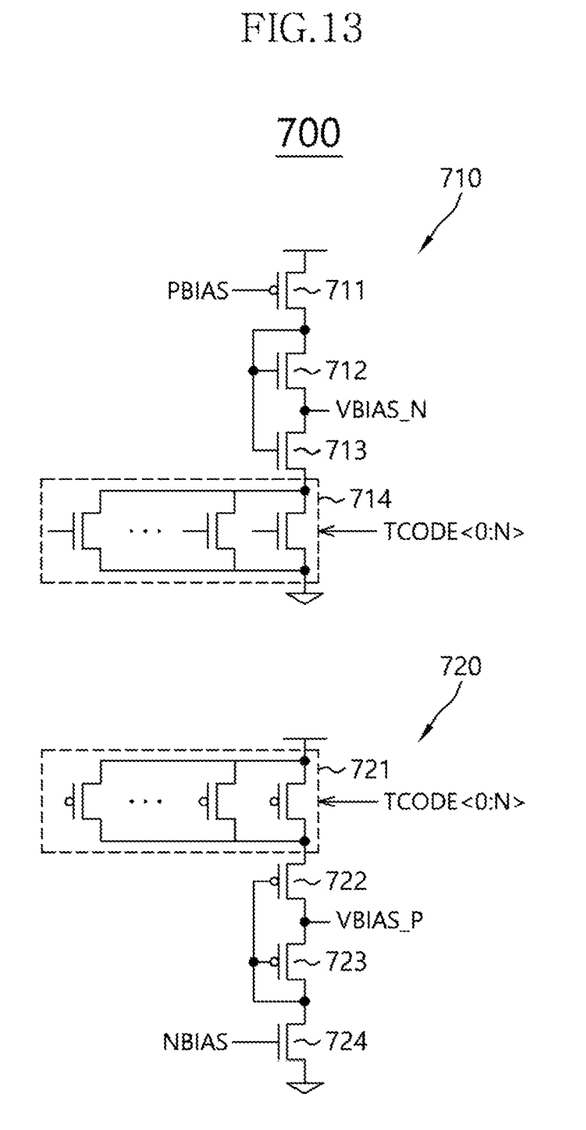
FIG. 13 is a diagram illustrating a configuration of a reference voltage circuit (700) of FIG. 12.

FIG. 13 is a diagram illustrating a configuration of the reference voltage circuit 700 of FIG. 12.

Referring to FIG. 13, the reference circuit 700 may include a first divider circuit 710 and a second divider circuit 720.

The first divider circuit 710 may generate the third bias signal VBIAS_N according to the second bias signal PBIAS and the temperature codes TCODE<0:N>.

Each of the first and second divider circuits 710 and 720 may comprise transistors configured to operate as resistors.

The first divider circuit 710 may include a PMOS transistor 711 coupled to a power source terminal, two NMOS transistors 712 and 713 serially coupled to the PMOS transistor and a temperature compensation circuit 714 coupled between the NMOS transistor 713 and a ground terminal. The temperature compensation circuit 714 may include a plurality of NMOS transistors coupled in parallel with each other. The temperature codes TCODE<0:N> may be inputted to gates of the plurality of NMOS transistors bit by bit. Resistance value of the temperature compensation circuit 714 may be changed according to the temperature codes TCODE<0:N>. For example, the value of the temperature codes TCODE<0:N> may be inversely proportional to the resistance value of the temperature compensation circuit 714. The resistance value of the temperature compensation circuit 714 may be decreased (or increased) according to increasing (or decreasing) of the temperature of the semiconductor apparatus.

The PMOS transistor 711 coupled to the power source terminal may receive, through a gate thereof, the second bias signal PBIAS. The first divider circuit 710 may generate the third bias signal VBIAS_N by distributing a power source voltage at a first distribution ratio. The third bias signal VBIAS_N may have a value proportional to a threshold voltage of the NMOS transistors in the first divider circuit 711.

The second divider circuit 720 may generate the fourth bias signal VBIAS_P according to the first bias signal NBIAS and the temperature codes TCODE<0:N>.

The second divider circuit 720 may include a NMOS transistor 724 coupled to a ground terminal, two PMOS transistors 722 and 723 serially coupled between the NMOS transistor 724 and a temperature compensation circuit 721 coupled between the PMOS transistor 722 and a power terminal. The temperature compensation circuit 721 may include a plurality of PMOS transistors coupled in parallel with each other. The temperature codes TCODE<0:N> may be inputted to gates of the plurality of PMOS transistors bit by bit. Resistance value of the temperature compensation circuit 721 may be changed according to the temperature codes TCODE<0:N>. For example, the value of the temperature codes TCODE<0:N> may be inversely proportional to the resistance value of the temperature compensation circuit 721. The resistance value of the temperature compensation circuit 721 may be decreased (or increased) according to increasing (or decreasing) of the temperature of the semiconductor apparatus.

The NMOS transistor 724 coupled to the ground terminal may receive, through gate thereof, the first bias signal NBIAS. The second divider circuit 720 may generate the fourth bias signal VBIAS_P by distributing the power source voltage at a second distribution ratio. The fourth bias signal VBIAS_P may have a value proportional to a threshold voltage of the PMOS transistors in the second divider circuit 222.

While various embodiments have been described above, it will be understood to those skilled in the art that the embodiments described are examples only. Accordingly, the data storage device and the operating method thereof described herein should not be limited based on the described embodiments.

What is claimed is:

1. An input circuit comprising:
   a skew detection circuit configured to operate a basic logic element forming a semiconductor device in each of a saturation region and a subthreshold region, and detect characteristic variation of the basic logic element depending on variation in process, operating voltage, or temperature, and generate a plurality of skew detection signals;
   an operation circuit configured to generate a source control signal and a sink control signal by combining the plurality of skew detection signals; and
   a buffer configured to vary an amount of a source current in response to the source control signal and vary an amount of a sink current in response to the sink control signal.

2. The input circuit according to claim 1,
   wherein the operation circuit comprises:
   a first logic circuit configured to generate the source control signal by performing a first combination operation on the plurality of skew detection signals; and
   a second logic circuit configured to generate the sink control signal by performing a second combination operation on the plurality of skew detection signals.

3. The input circuit according to claim 1, wherein the buffer comprises:
   an amplifier circuit configured to generate an output signal by amplifying an input signal relative to a reference voltage;
   at least one source current transistor configured to provide an additional current source to the amplifier circuit in response to the source control signal; and
   at least one sink current transistor configured to provide an additional current sink to the amplifier circuit in response to the sink control signal.

4. The input circuit according to claim 1, wherein the buffer has a rail-to-rail structure designed to allow an output signal to have full swing over an entire range of a power source voltage.

5. The input circuit according to claim 1, wherein the skew detection circuit comprises:
   a bias circuit configured to generate a first bias signal having a value to operate an NMOS transistor in the saturation region, and a second bias signal having a value to operate a PMOS transistor in the saturation region;
   a reference voltage circuit configured to generate a third bias signal having a value to operate the NMOS transistor in the subthreshold region, and a fourth bias signal having a value to operate the PMOS transistor in the subthreshold region; and
   a detection circuit configured to generate the plurality of skew detection signals in response to the first to fourth bias signals.

6. The input circuit according to claim 5,
   wherein the input circuit further comprises a temperature sensor,
   and the reference voltage circuit is configured to change levels of the third bias signal and the fourth bias signal according to temperature codes generated by the temperature sensor.

7. The input circuit according to claim 5, wherein the detection circuit comprises:
   a first detection circuit configured to generate, using the first and fourth bias signals, a first skew detection signal and a second skew detection signal; and
   a second detection circuit configured to generate, using the second and third bias signals, a third skew detection signal and a fourth skew detection signal.

8. The input circuit according to claim 7, wherein the first detection circuit comprises:
   first and second transistors coupled between a power source terminal and a ground terminal and configured to output a first preliminary skew detection signal;
   third and fourth transistors coupled between the power source terminal and the ground terminal and configured to output a second preliminary skew detection signal; and
   a plurality of inverters configured to receive the first preliminary skew detection signal and the second preliminary skew detection signal and output the first skew detection signal and the second skew detection signal according to the first preliminary skew detection signal and the second preliminary skew detection signal, respectively, and
   wherein the first transistor and the third transistor are controlled by the fourth bias signal, and the second transistor and the fourth transistor are controlled by the first bias signal.

9. The input circuit according to claim 7, wherein the second detection circuit comprises:
   first and second transistors coupled between a power source terminal and a ground terminal and configured to output a third preliminary skew detection signal;
   third and fourth transistors coupled between the power source terminal and the ground terminal and configured to output a fourth preliminary skew detection signal;
   a plurality of inverters configured to receive the third preliminary skew detection signal and the fourth preliminary skew detection signal and output the third skew detection signal and the fourth skew detection signal according to the third preliminary skew detection signal and the fourth preliminary skew detection signal, respectively, and wherein the first transistor and the third transistor are controlled by the second bias signal, and the second transistor and the fourth transistor are controlled by the third bias signal.

* * * * *